(12) United States Patent
Ding et al.

(10) Patent No.: US 6,790,776 B2
(45) Date of Patent: Sep. 14, 2004

(54) BARRIER LAYER FOR ELECTROPLATING PROCESSES

(75) Inventors: Peijun Ding, San Jose, CA (US); Tony Chiang, Santa Clara, CA (US); Tse-Yong Yao, San Francisco, CA (US); Barry Chin, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 10/016,255

(22) Filed: Dec. 10, 2001

(65) Prior Publication Data

US 2002/0092772 A1 Jul. 18, 2002

Related U.S. Application Data

(63) Continuation of application No. 09/375,167, filed on Aug. 16, 1999, now Pat. No. 6,328,871.

(51) Int. Cl.[7] .......................... C23C 14/34; H01L 21/44
(52) U.S. Cl. .................. 438/685; 438/643; 438/648; 438/653; 438/656; 438/675; 438/680; 438/687; 204/192.17; 427/99; 427/97
(58) Field of Search .................. 204/192.17, 192.15; 427/250, 252, 253, 99, 97, 576; 438/643, 648, 653, 656, 675, 680, 685, 687

(56) References Cited

U.S. PATENT DOCUMENTS

| | | | | |
|---|---|---|---|---|
| 4,753,851 A | | 6/1988 | Roberts et al. | 428/627 |
| 5,155,336 A | | 10/1992 | Gronet et al. | 219/411 |
| 5,354,712 A | * | 10/1994 | Ho et al. | 438/643 |
| 5,591,672 A | | 1/1997 | Lee et al. | 437/190 |
| 5,885,898 A | | 3/1999 | Kim et al. | 438/663 |
| 5,891,513 A | | 4/1999 | Dubin et al. | 427/98 |
| 5,899,740 A | | 5/1999 | Kwon | 438/627 |
| 5,972,179 A | * | 10/1999 | Chittipeddi et al. | 204/192.17 |
| 6,069,068 A | | 5/2000 | Rathore et al. | 438/628 |
| 6,071,814 A | | 6/2000 | Jang | 438/687 |
| 6,140,234 A | | 10/2000 | Uzoh et al. | 438/678 |
| 6,146,517 A | * | 11/2000 | Hoinkis | 205/186 |
| 6,153,519 A | | 11/2000 | Jain et al. | 438/681 |
| 6,179,973 B1 | * | 1/2001 | Lai et al. | 204/192.12 |

FOREIGN PATENT DOCUMENTS

| | | | | |
|---|---|---|---|---|
| EP | 0 867 525 | * | 9/1998 | |
| EP | 0 869 544 | | 10/1998 | H01L/21/285 |
| EP | 0 930 647 | | 7/1999 | H01L/21/768 |
| WO | WO 98/54377 | * | 12/1998 | |

OTHER PUBLICATIONS

Austrian Search Report dated Sep. 13, 2002, for Singapore Appln No. 200004521–1.
European Search Report from EP 00 30 7009, Dated Aug. 10, 2001.
Koikeda T., et al.: Electronics and Communications in Japan, Scripta Technica, "Temperature Coefficient of Tantalum Nitride Film Resistors," New York, US, Dec. 1970, vol. 530, No. 12, pp. 136–142.

* cited by examiner

Primary Examiner—Rodney G. McDonald
(74) Attorney, Agent, or Firm—Moser, Patterson & Sheridan

(57) ABSTRACT

The invention generally provides a method for preparing a surface for electrochemical deposition comprising forming a high conductance barrier layer on the surface and depositing a seed layer over the high conductance barrier layer. Another aspect of the invention provides a method for filling a structure on a substrate, comprising depositing a high conductance barrier layer on one or more surfaces of the structure, depositing a seed layer over the barrier layer, and electrochemically depositing a metal to fill the structure.

19 Claims, 3 Drawing Sheets

BARRIER LAYER FOR ELECTROPLATING PROCESSES

CROSS-REFERENCE TO RELATED APPLICATIONS

This application is a continuation of U.S. patent application Ser. No. 09/375,167, filed Aug. 16, 1999. Now U.S. Pat. No. 6,328,871 The aforementioned related patent application is herein incorporated by reference.

BACKGROUND OF THE INVENTION

1. Field of the Invention

The present invention generally relates to electrochemical deposition or electroplating a metal onto a substrate. More particularly, the present invention relates to methods of forming a barrier layer and a seed layer prior to filling the structures formed on a substrate using an electroplating process.

2. Description of the Related Art

Copper has become a choice metal for filling sub-micron, high aspect ratio interconnect features on substrates as circuit densities increase for the next generation of ultra large scale integration because copper and its alloys have lower resistivities and significantly higher electromigration resistance as compared to aluminum. These characteristics are important for supporting the higher current densities experienced at high levels of integration and increased device speed.

The aspect ratio for the features, i.e., the ratio of the feature height to the feature width, increases with higher levels of integration. Many traditional deposition processes have difficulty filling structures where the aspect ratio exceeds 4:1, and particularly where it exceeds 10:1 and is less than 0.25 $\mu$m wide. Therefore, there is a great amount of ongoing effort being directed at the formation of void-free, sub-micron high aspect ratio features. Additionally, as the feature widths decrease, the interconnect features experience increased current densities that require good, voidless formation of the metal within the interconnect feature.

Despite the desirability of using copper for semiconductor device fabrication, choices of fabrication methods for depositing copper into very high aspect ratio features are limited because common chemical vapor deposition processes and physical vapor deposition processes have provided unsatisfactory results for forming voidless metallization of sub-micron high aspect ratio interconnect features. As a result, electroplating or electrochemical deposition is becoming an accepted method for copper metallization of interconnect features on semiconductor devices.

FIGS. 1A–1E illustrate a typical metallization technique for forming interconnect features in a multi-layered substrate 10. Generally, the method comprises physical vapor depositing a barrier layer over the feature surfaces, physical vapor depositing a conductive metal seed layer, preferably copper, over the barrier layer, and then electroplating a conductive metal, preferably copper, over the seed layer to fill the interconnect structure/feature. Finally, the deposited layers and the dielectric layers are planarized, such as by chemical mechanical polishing (CMP), to define a conductive interconnect feature.

FIGS. 1A through 1E are cross sectional views of a substrate 10 having multi-layered structures including a dielectric layer 12 formed over an underlying layer 14 which contains an electrically conducting feature 16. The underlying layer 14 may take the form of a doped silicon substrate or it may be a first or subsequent dielectric/insulating layer formed on a substrate. The dielectric layer 12 is formed over the underlying layer 14 in accordance with procedures known in the art, such as dielectric CVD, to form a part of the overall integrateting circuit. Once deposited, the dielectric layer 12 is patterned and etched to form interconnect features, such as vias, contacts and lines. Etching of the dielectric layer 12 can be accomplished using various generally known dielectric etching processes, including plasma etching. Although a dual damascene structure and a connection line are illustrated in FIGS. 1A–1E, other types of interconnect features are typically metallized using this technique as well.

Referring to FIG. 1A, a partial cross-sectional diagram of a substrate 10 is shown having a dual damascene structure 18 and a connection line 20 patterned and etched in the dielectric layer 12. The dual damascene structure 18 typically comprises a via portion 21 and a trench portion 25. The via portion 21 of the dual damascene structure 18 is defined by a via floor 22 exposing at least a portion of the conductive feature 16 and lower sidewalls 24. The trench portion 25 of the dual damascene structure 18 is defined by the step surfaces 26 and upper sidewalls 28. FIG. 1A also shows a connection line 20 which is typically formed through a groove on the surface of the dielectric layer 12 that provides electrical connections across the surface of the dielectric layer 12 to other structures and/or devices. The connection line 20 is defined by a line bottom surface 30 and line sidewalls 32 etched in the dielectric layer 12.

Referring to FIG. 1B, a barrier layer 34, preferably comprising tantalum (Ta) or tantalum nitride (TaN), is deposited over the surface of the substrate 10, including the surfaces of the dual damascene structure 18 and the connection line 20. The barrier layer is typically deposited using physical vapor deposition (PVD) by sputtering a tantalum target in an argon plasma or by reactive physical vapor deposition by sputtering a tantalum target in a nitrogen/argon plasma. Other deposition processes, such as chemical vapor deposition (CVD) or combination of CVD/PVD, may be used to deposit the barrier layer for improved texture and film properties. The barrier layer limits the diffusion of copper into the semiconductor substrate and the dielectric layer and thereby dramatically increases the reliability of the copper interconnect features. It is preferred that the barrier layer has a thickness between about 25 Å and about 400 Å, most preferably about 100 Å.

Referring to FIG. 1C, a copper seed layer 36 is deposited over the barrier layer 34 using PVD. Other metals, particularly noble metals, can also be used for the seed layer. The copper seed layer 36 provides good adhesion for a subsequently deposited copper layer.

Referring to FIG. 1D, a copper layer 38 is electroplated over the copper seed layer 36 to metallize the dual damascene structure 18 and the line connection 20. However, the electroplating metallization process presently practiced typically forms voids 40 in the interconnect features that may lead to defective devices or premature breakdown of the devices, as discussed in more detail below.

Referring to FIG. 1E, the top portion of the processed substrate 10, i.e., the exposed copper layer 38, is then planarized, preferably by chemical mechanical polishing (CMP). During the planarization process, portions of the copper layer 38, copper seed layer 36, barrier layer 34, and a top surface of the dielectric layer 12 are removed from the top surface of the substrate, leaving a fully planar surface with conductive interconnect features, such as the dual damascene structure 18 and connection line 20.

Metal electroplating in general is a well known art and can be achieved by a variety of techniques. Present designs of cells for electroplating a metal onto a substrate are generally based on a fountain plater configuration. In the fountain plater configuration, the semiconductor substrate is positioned above a cylindrical electrolyte container with the plating surface facing an opening of the cylindrical electrolyte container. The electrolyte is pumped to flow upwardly and contact the substrate plating surface. The substrate is electrically biased and connected as the cathode of the plating system, and the surfaces to be plated are electrically connected to the cathode power source to provide the electrical current that induces the metal ions in the plating solution to deposit onto the exposed conductive surface of the substrate. An anode is typically disposed in the electrolyte and electrically biased to attract the negatively charged counterparts of the metal ions in the electrolyte. The fountain plater is generally adequate for electroplating large, low aspect ratio features (i.e., larger than micrometer-sized and lower than 1:1 height to width ratio). However, a number of obstacles impair consistent electroplating of copper onto substrates having sub-micron, high aspect ratio features.

First, a continuous metal seed layer is essential for conducting the current required to the surfaces to be plated by the electroplating process. When a discontinuity is present in the metal seed layer, the portion of the seed layer that is not electrically connected to the bias power supply does not receive deposition during the electroplating process. Particularly with physical vapor deposition of a seed layer, it is very difficult to deposit a continuous, uniform seed layer within a high aspect ratio, sub-micron feature. The seed layer tends to become discontinuous especially at the bottom surface of the feature because it is difficult to deposit through the narrow (i.e., sub-micron) aperture width of the feature. The discontinuities in the seed layer prevent proper electroplating of the metal onto the seed layer, resulting in defective devices on the processed substrate.

Second, discontinuities in the metal seed layer also cause void formations in high aspect ratio interconnect features. During the electroplating process, the metal deposits on all of the surfaces that are electrically connected to the bias power supply. Because the electroplated metal grows in all directions, the deposition around an area of discontinuity in the seed layer typically forms a bridge over the discontinuity, leaving a void adjacent the discontinuity within the feature. The void changes the material and operating characteristics of the interconnect feature and may cause improper operation and premature breakdown of the device.

Therefore, there is a need for a consistent metal electroplating technique to form void-less metal interconnects in sub-micron, high aspect ratio features on semiconductor substrates. Particularly, there is a need for a method for preparing a substrate prior to electroplating that overcomes the problems presented by currently practiced seed layers used in electroplating and reduces the formation of defective devices due to unsatisfactory electroplating results.

SUMMARY OF THE INVENTION

The invention generally provides a method for preparing a substrate prior to electroplating for forming void-less metal interconnects in sub-micron, high aspect ratio features on semiconductor substrates. The invention overcomes the problems presented by currently practiced barrier layers used in electroplating and reduces the formation of defective devices caused by unsatisfactory electroplating results. Generally, the invention provides a method for forming a high conductance (i.e., resistivity $<<160$ $\mu\Omega$-cm) barrier layer on which metal can be electro-chemically deposited to significantly reduce the defect formations formed during the electroplating process due to discontinuities in the seed layer.

One aspect of the invention provides a method for preparing a surface for electrochemical deposition comprising forming a high conductance barrier layer on the surface and depositing a seed layer over the barrier layer. Preferably, the high conductance barrier layer comprises a material selected from tungsten, tungsten nitride ($WN_x$, where $x \leq 3$), titanium and titanium nitride, and/or combinations thereof. The high conductance barrier layer provides a surface on which metal can be electro-chemically deposited and therefore, significantly reduces the defect formations formed during the electroplating process due to discontinuities in the seed layer.

Another aspect of the invention provides a method for forming a high conductance barrier layer comprising depositing a layer of tantalum and annealing the deposited tantalum layer at a temperature between about 350° C. and about 600° C. for between about 30 seconds and about 30 minutes.

Another aspect of the invention provides a method for forming a high conductance barrier layer comprising depositing a tantalum barrier layer at a substrate temperature between about 350° C. and about 600° C.

Yet another aspect of the invention provides a method for forming a high conductance barrier layer comprising forming a first barrier layer comprising a material such as $TiN_x$, W or $WN_x$, over the surface using chemical vapor deposition and forming a second barrier layer comprising a barrier material such as $TiN_x$, Ta or $TaN_x$, over the first barrier layer using physical vapor deposition.

Yet another aspect of the invention provides a method for filling a structure on a substrate, comprising depositing a high conductance barrier layer on one or more surfaces of the structure, depositing a seed layer over the barrier layer, and electrochemically depositing a metal to fill the structure.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1A:
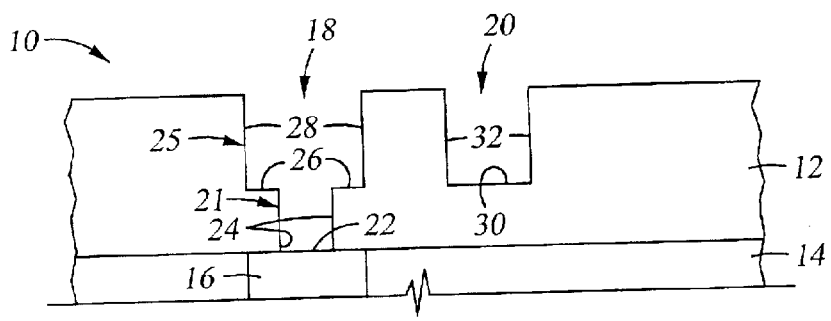
FIGS. 1A–1E are cross sectional views of a dual damascene interconnect and a connection line in a dielectric layer illustrating a metallization technique for forming such interconnects.
Figure 1B:
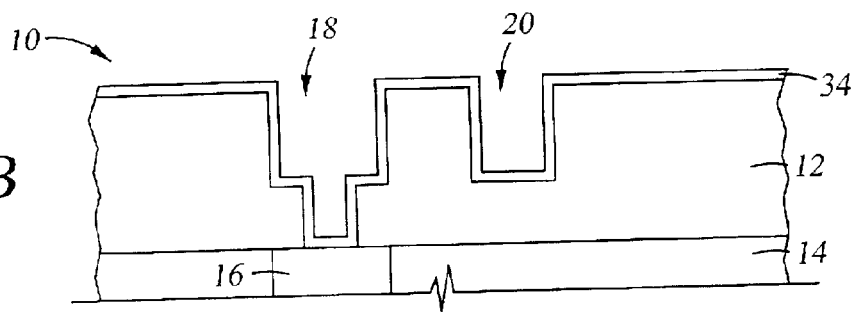
Figure 1C:
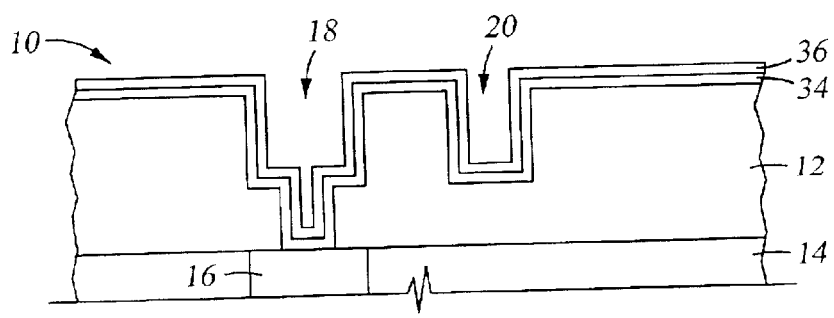
Figure 1D:
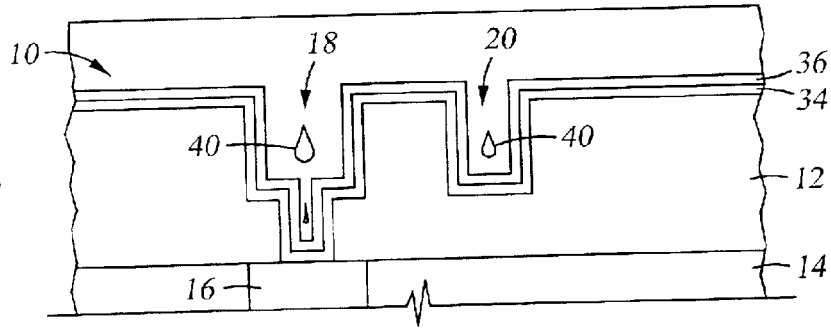
Figure 1E:
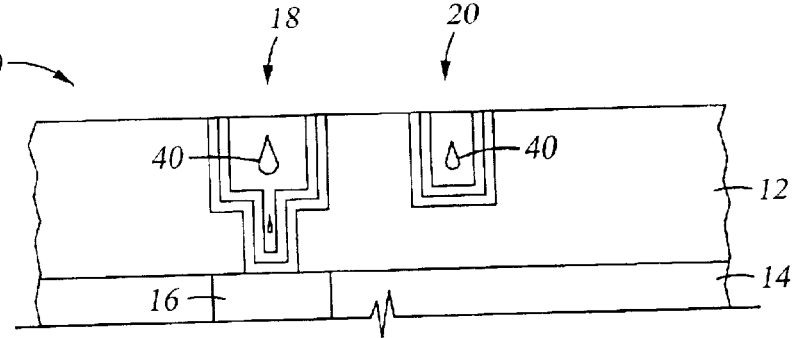

The present invention provides methods for improving the electroplating fill of high aspect ratio, sub-micron interconnect features. Although the invention is described using a dual damascene structure on a substrate, the invention contemplates applications in other interconnect features and other integrated circuit features (i.e., lines, vias, contacts, plugs, etc.) that require filling the features formed on a substrate with a metal. Also, although the invention is described using copper as the electroplated metal for metallization of the feature, the invention is applicable to other metals that can be electroplated onto a substrate.

Generally, a continuous metal seed layer is essential for conducting an electrical current to the surfaces to be plated by the electroplating process. Typically, the seed layer is deposited using PVD techniques, which has not provided satisfactory results for forming a uniform, continuous seed layer at the bottom of high aspect ratio, sub-micron features. Thus, currently practiced electroplating techniques suffer from defect formation due to discontinuities in the seed layer. The invention generally provides a method for forming a barrier layer that reduces the need for a continuous seed layer.

High Conductance Barrier Layer Materials

One aspect of the invention improves the electroplating fill of high aspect ratio, sub-micron interconnect features through the use of a high conductance barrier layer material that provides sufficient electrical conductivity to facilitate electro-chemical deposition thereon. The inventors have discovered that the detrimental effects of a discontinuous seed layer are significantly minimized by providing a barrier layer material having a surface on which a metal, particularly copper, can be electroplated. The barrier layer materials that have this property include tungsten (W), tungsten nitride ($WN_x$, where $0 \geq x \leq 3$), titanium (Ti), titanium nitride (TiN) and combinations thereof. Alternatively, the barrier layer comprises a multi-layered stack of these materials as well as alloys of these materials. The barrier layer according to the invention can be deposited over the surfaces of the features/structures formed on the substrate using PVD, CVD or other deposition methods commonly known in the art. Preferably, the barrier layer has a thickness between about 10 Å and about 500 Å for a sub-micron interconnect feature. Because a metal, particularly copper, can be electroplated directly onto the surfaces of these barrier materials the metal deposits (i.e., electroplates) on the surfaces of the seed layer as well as on exposed surfaces of the barrier layer not covered by the seed layer, resulting in a significant reduction of the formation of defects due to the discontinuities in the seed layer.

High Conductance Tantalum Barrier Layer

Another aspect of the invention provides a method for forming a high conductance barrier layer comprising annealing a deposited tantalum (Ta) barrier layer. The inventors have discovered a method for significantly improving the conductance of a tantalum barrier layer deposited using physical vapor deposition techniques. According to the invention, a barrier layer comprising tantalum is deposited using typical PVD techniques, preferably in a high density plasma (HDP) PVD chamber, such as the IMP™ chamber available from Applied Materials, Inc., Santa Clara, Calif.

Figure 2:
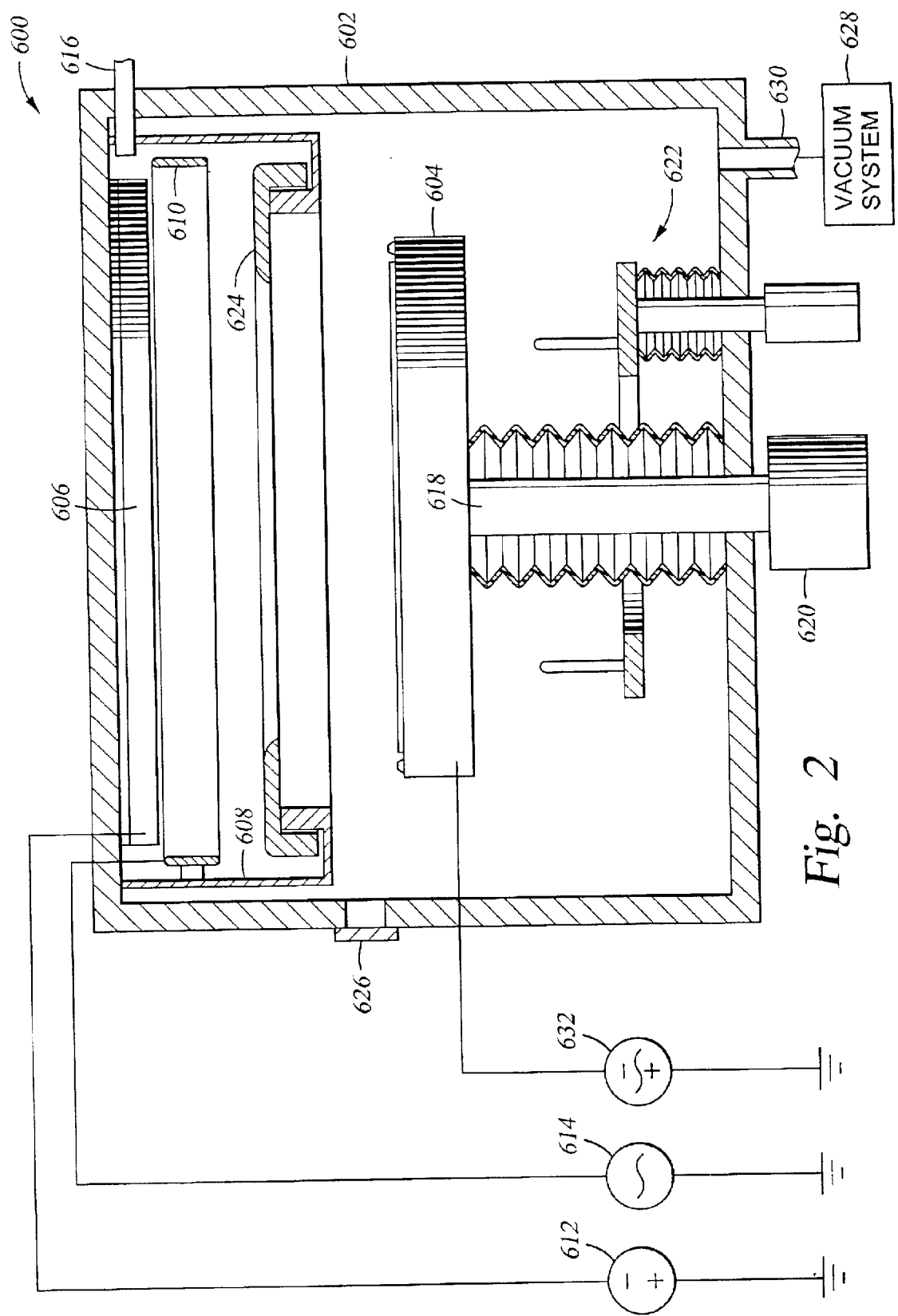
FIG. 2 is a cross sectional view of a high density plasma physical vapor deposition (HDP-PVD) chamber useful for forming a barrier layer according to the invention.

FIG. 2 is a cross sectional view of a high density plasma physical vapor deposition (HDP-PVD) chamber useful for forming a barrier layer according to the invention. The HDP-PVD deposition chamber 600 generally includes a chamber enclosure 602, a substrate support member 604, a target 606, a shield 608 and a coil 610. The target 606 comprises a sputterable material and is disposed opposite of the substrate support member 604. The target 606 is electrically connected to a DC power supply 612, as shown in FIG. 2, and can be biased by an RF power source (not shown) instead of the DC power supply 612. The shield 608 generally surrounds the region between the target 606 and the substrate support member 604 and is typically connected to a ground connection. The coil 610 is disposed interior of the shield 608 and is connected to an RF power supply 614. A gas inlet 616 disposed through the enclosure 602 introduces one or more processing gases into the chamber during processing. A vacuum system 628 is connected to the chamber 600 through an exhaust port 630 to exhaust gases in the chamber and maintain a desired pressure in the chamber. Preferably, the vacuum system 628 comprises one or more vacuum pumps, turbo-molecular pumps, roughing pumps or cryopumps.

As shown in FIG. 2, the substrate support member 604 is attached to an actuator shaft 618 disposed through the bottom of the enclosure 602. The actuator shaft 618 is connected to an actuator 620 which facilitates movement of the substrate support member 604 to various positions in the chamber. A slit valve 626 disposed on a sidewall of the enclosure 602 facilitates transfer of substrates into and out of the chamber, which is typically performed utilizing a robot and robot blade. A substrate lift assembly 622 disposed relative to the substrate support member 604 facilitates positioning of a substrate onto and off of the substrate support member 604. As shown in FIG. 2, the substrate support member 604 is in a wafer transfer position. During processing, the substrate support member 604 positions a substrate disposed thereon to a position below a cover ring 624 disposed on a lower portion of the shield 608 to shield the perimeter edge of the substrate from deposition. The substrate support member 604 engages the cover ring 624 and typically lifts the cover ring 624 off the shield 608. At this position, a processing region is defined by the exposed surface of the target 606, the shield 608 and the substrate on the substrate support member 604. A power supply 632 is electrically connected to the substrate support member 604 to provide an electrical bias to the substrate during processing. The power supply 632 can be a DC power source, an RF power source, or a combination of DC and RF power sources.

Several parameters of the HDP-PVD process, including the processing pressure, the RF bias to the RF coil, the DC or RF bias to the target, and the DC or RF bias to the substrate, can be adjusted to achieve the desired seed layer deposition profile having minimal sidewall coverage and substantial bottom coverage. Preferably, the HDP-PVD chamber is operated within the following parameters: chamber processing pressure between about 20 mTorr and about 100 mTorr, RF source power to the HDP-PVD coil between about 1000 W and about 5000 W, target DC bias between about 500 W and about 3000 W, and substrate DC bias between about 100 W and about 500 W.

Preferably, the deposited Ta barrier layer has a thickness between about 10 Å and about 500 Å, and more preferably between about 100 and about 250 Å. The deposited PVD Ta barrier layer is annealed at a temperature between about 350° C. and about 600° C. for between about 30 seconds and about 30 minutes, preferably in a vacuum environment. The length of the anneal treatment varies depending on the anneal temperature and the design of the anneal chamber. A variety of anneal chamber designs, including conventional and rapid thermal anneal chambers, are well known in the art and commercially available. For example, the anneal process can be performed utilizing the RTP XEplus™ or the RTP XE™ thermal processing chambers available from Applied Materials, Inc., Santa Clara, Calif., or the thermal processing chamber described in U.S. Pat. No. 5,155,336, Gronet et al., which is hereby incorporated by reference in its entirety. The inventors also contemplate using other commercially available thermal processors from manufacturers such as Eaton Corporation Thermal Processing Systems, Peabody, Mass. For a conventional furnace anneal chamber, the anneal treatment is preferably carried out for between about 5 minutes and 30 minutes at between about 450° C. and 500° C. For a rapid thermal anneal chamber, the anneal treatment is preferably carried out for between about 30 seconds and 5 minutes at between about 450° C. and 500° C. The inventors have discovered that after the anneal treatment, the PVD Ta barrier layer exhibits a high conductance (or low resistivity) that is about 16 times that of a conventional PVD Ta layer without an annealing treatment. The PVD Ta layer deposited according to the invention exhibits low resistivity of about 10 $\mu\Omega$-cm as compared to conventional PVD Ta layers without annealing treatment which typically have a resistivity of about 160 $\mu\Omega$-cm. The high conductance annealed PVD Ta barrier layer according to the invention is able to conduct sufficient electrical current where discontinuities in the seed layers exist and therefore allow electrochemical deposition to occur where the Ta layer is exposed at the discontinuities in the seed layer.

Alternatively, instead of annealing a typical PVD Ta barrier layer, the invention provides a method for forming a high conductance barrier layer comprising depositing a tantalum barrier layer at a substrate temperature between about 350° C. and about 600° C. The temperature of the substrate during the deposition process is preferably controlled by controlling the temperature of the substrate support surface on the substrate support member or pedestal. The inventors have discovered that a PVD Ta layer deposited in this temperature range exhibits unexpected high conductance (or low resistivity). The PVD Ta layer deposited according to the invention exhibits a low resistivity of about 10 $\mu\Omega$-cm, which is about 16 times more conductive than PVD Ta films deposited at low temperatures without annealing. One example of a process for forming a high conductance barrier layer on a 200 mm substrate using an HDP-PVD chamber (as shown in FIG. 2) include the following processing parameters: chamber processing pressure between about 20 mTorr and about 100 mTorr, RF source power to the HDP-PVD coil between about 1000 W and about 5000 W, target DC bias between about 500 W and about 3000 W, substrate DC bias between about 100 W and about 500 W, and substrate temperature between about 350° C. and about 600° C.

Combination Of CVD And PVD Barrier Layers

Another aspect of the invention provides a method for forming a high conductance barrier layer comprising forming a first barrier layer over the surface using chemical vapor deposition and forming a second barrier layer over the first barrier layer using physical vapor deposition. The invention contemplates utilizing a variety of CVD techniques to form the first barrier layer, including well known CVD techniques such as metal organic chemical vapor deposition (MOCVD), atmospheric pressure chemical vapor deposition (APCVD) and plasma enhanced chemical vapor deposition (PECVD). The invention also contemplates utilizing a variety of PVD techniques to form the second barrier layer, including well known PVD techniques such as conventional sputtering, collimated sputtering, long throw sputtering, ionized metal plasma sputtering and hollow cathode sputtering. Preferably, the first and second barrier layers are formed utilizing an integrated system platform having both CVD and PVD processing chambers, such as the integrated system described in U.S. Pat. No. 5,186,718, Tepman et al., which is incorporated by reference in its entirety.

According to the invention, a first barrier layer, comprising a barrier material such as $TiN_x$, W or $WN_x$, is deposited using a CVD technique to provide a conformal barrier layer over the surfaces of the interconnect structure. Typically, for an interconnect structure/feature having sub-micron opening width, the first barrier layer is deposited using commonly known CVD techniques to a thickness between about 50 Å and about 250 Å. Then, a second barrier layer, comprising a barrier material such as $TiN_x$, Ta and $TaN_x$, is deposited over the first barrier layer using commonly known PVD techniques to a thickness between about 50 Å and about 250 Å. The resulting combined barrier layer comprising a first CVD layer and a second PVD layer provides an effective conductivity that is much higher than that of a PVD barrier layer alone or a CVD barrier layer alone because the CVD layer provides good conformal coverage of the feature surfaces while the PVD layer provides good bottom fill of the features.

Substrate Preparation and Metallization Process

Figure 3:
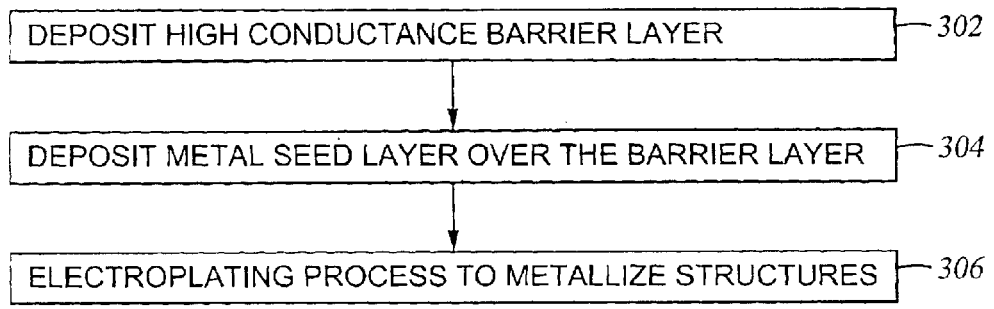
FIG. 3 is a flow diagram illustrating a metallization technique for filling an interconnect structure according to the invention.

FIG. 3 is a flow diagram illustrating a metallization technique for filling an interconnect structure according to the invention. First, a high conductance barrier layer is deposited (Step 302) over the surfaces of the substrate including the surfaces outlining the interconnect structure. The barrier material is deposited using one of the above-described techniques according to the invention. For a high conductance barrier layer comprising a high conductance material selected from the group consisting of tungsten, tungsten nitride ($WN_x$, where $x \leq 3$), titanium and titanium nitride, and the combinations thereof, the barrier layer can be deposited by a variety of deposition methods including PVD and CVD. The conductance of the barrier layer can be further improved by utilizing CVD techniques and PVD techniques to form a combination CVD ($TiN_x$, W or $WN_x$) and PVD ($TiN_x$, Ta or $TaN_x$) barrier layers. For a high conductance barrier layer comprising tantalum, the barrier layer is preferably deposited by low temperature (<350° C.) PVD and then annealed at between about 350° C. and about 600° C., or deposited by PVD at a high temperature between about 350° C. and about 600° C. Preferably, a barrier layer has a film thickness between about 250 Å and about 500 Å for an interconnect structure/feature having sub-micron opening width.

Second, a seed layer is deposited (Step 304) over the barrier layer, preferably, using HDP-PVD techniques to maximize the seed layer deposition on the bottom portion of the interconnect features and minimize the seed layer deposition on the sidewall portions of the interconnect feature. The copper seed layer is preferably deposited utilizing a HDP-PVD chamber, as described above in FIG. 2, having a copper target. Preferably, the HDP-PVD chamber is operated within the following parameters: chamber processing pressure between about 1 mTorr and about 100 mTorr, RF source power to the HDP-PVD coil between about 1000 W and about 5000 W, target DC bias between about 500 W and about 3000 W, and substrate DC bias between about 100 W and about 500 W. Alternatively, the seed layer can be formed by other deposition techniques, such as conventional PVD and CVD. The seed layer preferably has a sidewall film thickness less than about 250 Å and a bottom film thickness between about 250 Å and about 1500 Å. Step 302 and step 304 together prepare a substrate plating surface for the electroplating process that fills the interconnect features/structures.

Figure 4:
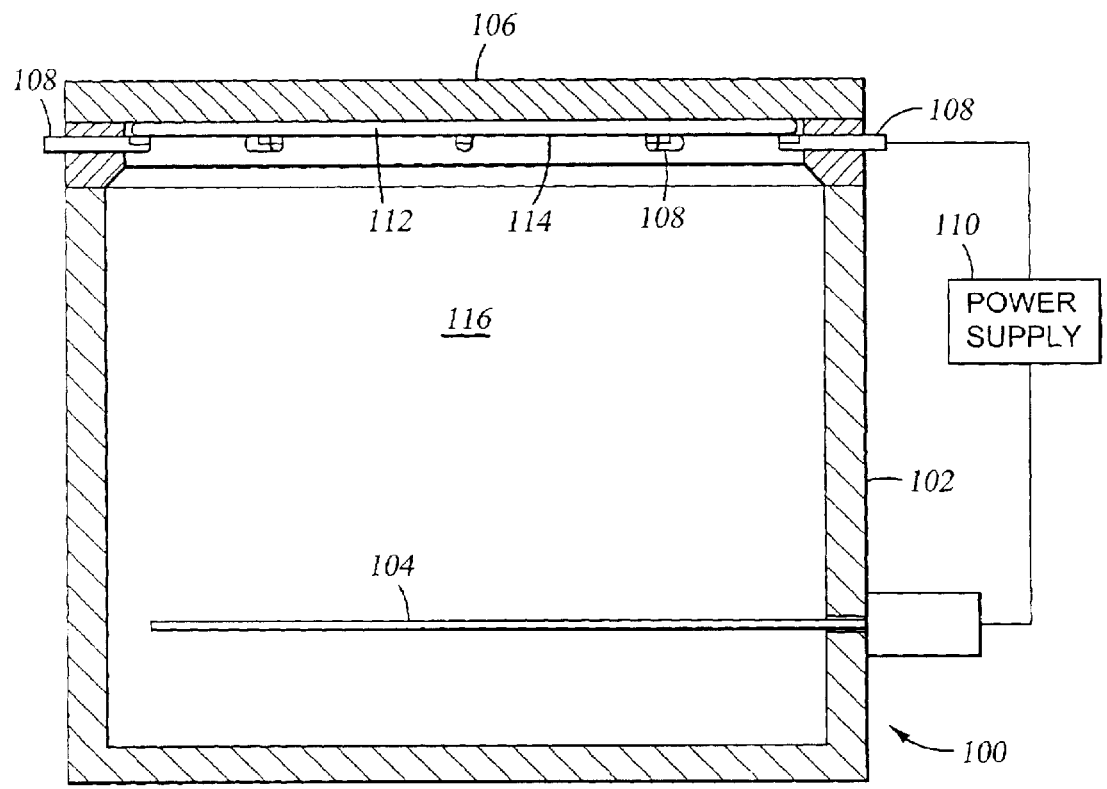
FIG. 4 is a cross sectional view of a simplified electroplating apparatus 100.

Next, the electroplating process (Step 306) is performed to metallize the structures on the substrate. The electroplating process can be accomplished using a variety of electroplating apparatus and techniques. FIG. 4 is a cross sectional view of a simplified electroplating apparatus 100. Although the invention is described using a simplified electroplating apparatus, the inventors contemplate utilizing other electroplating apparatuses to achieve the desired processing results, such as the Millenia™ ECP system, available from Applied Materials, Inc., Santa Clara, Calif., and the electrochemical deposition system described in commonly assigned and copending U.S. patent application Ser. No. 09/289,074, entitled "Electro-chemical Deposition System", filed on Apr. 8, 1999, which is hereby incorporated by reference in its entirety. As shown in FIG. 4, the simplified electroplating apparatus 100 includes a container 102, an anode 104, a substrate holder 106, a cathode 108 and a power supply 110 connected between the cathode 108 and the anode 104. A substrate 112 is positioned on the substrate holder 106, and the cathode 108 contacts the seed layer on the substrate plating surface. The power supply delivers an electrical current to the seed layer on the substrate plating surface 114. An electroplating solution or electrolyte 116 fills the container 102 to allow the substrate plating surface 114 to be completely submerged in the electrolyte during the electroplating process. The electrolyte 116 supplies the metal to be electrochemically deposited onto the seed layer of the substrate, and the anode 104 is a non-consumable anode. Alternatively, the anode 102 is a consumable anode that supplies the metal (i.e., copper) to be electrochemically deposited onto the substrate, and the electrolyte 116 effectuates the transfer of the metal from the anode to the cathode.

During an electroplating process, the power supply 110 provides a negative voltage to the cathode 108 and a positive voltage to the anode 104 to effectuate electrochemical deposition of the metal ions in the electrolyte 116 onto the substrate plating surface 114. The electrical power (i.e., voltage and current) supplied to the substrate plating surface 114 is adjusted according to the electroplating solution used and desired deposition rate and characteristics. For example, to deposit a copper layer on a 200 mm substrate using copper sulfate as the electroplating solution, the cathode 108 is biased to provide a forward plating current density across the substrate plating surface at between about 10 mA/cm² and about 80 mA/cm². The copper electroplating solution preferably comprises multi-components including copper electrolyte and additives such as suppressers and brighteners/accelerators. A detailed description of the electroplating chemistry, particularly the composition of the electrolyte and additives, is provided in commonly assigned and copending U.S. patent application Ser. No. 09/245,780, entitled "Electrodeposition Chemistry for Improved Filling of Apertures," filed on Feb. 5, 1999, which is hereby incorporated by reference in its entirety.

Optionally, a de-plating step is periodically performed during the electroplating process to enhance the metallization process. Preferably, the de-plate process is carried out using the electroplating apparatus with the bias polarity reversed (opposite of the forward electroplating polarity) to cause a portion of the deposited metal to be removed from the interconnect feature. Because the de-plating process tends to remove more deposited material from the opening of the interconnect feature, void formations in the interconnect features are further reduced. For example, the de-plating process is carried out by applying to the substrate a de-plating voltage at between about 10 V and about 25 V magnitude or a de-plating (reverse) current density across the substrate plating surface at between about 10 mA/cm² and about 80 mA/cm² magnitude. Typically, the de-plating voltage is applied for between about 0.1 seconds and about 5 seconds. The electroplating process is resumed after the de-plating process to complete the metallization of the structure.

After the electroplating fill or metallization of the structure, the surface of the processed substrate is typically planarized using CMP techniques or other planarization methods, and the substrate is ready for other processes to complete the fabrication of the integrated circuit.

While the foregoing is directed to the preferred embodiment of the present invention, other and further embodiments of the invention may be devised without departing from the basic scope thereof. The scope of the invention is determined by the claims which follow.

What is claimed is:

1. A method of forming a high conductance barrier layer, comprising:
    depositing a first barrier layer to a thickness between about 50 Å and about 250 Å over a surface using chemical vapor deposition;
    depositing a second barrier layer to a thickness between about 50 Å and about 250 Å over the first barrier layer using physical vapor deposition, wherein the second barrier layer comprises a material selected from the group consisting of tantalum, tantalum nitride, and combinations thereof, wherein the first barrier layer and the second barrier layer form a high conductance barrier layer having a resistivity of less than about 160 $\mu\Omega$-cm.

2. The method of claim 1, wherein depositing a second barrier comprises depositing the second barrier layer utilizing high density plasma physical vapor deposition.

3. The method of claim 2, wherein the second barrier layer is deposited at a substrate temperature between about 350° C. and about 600° C.

4. The method of claim 2, wherein the second barrier layer is deposited at a processing pressure between 20 mTorr and about 100 mTorr.

5. The method of claim 2, wherein the second barrier layer is deposited at a substrate temperature between about 350° C. and about 600° C. and at a processing pressure between about 20 mTorr and about 100 mTorr.

6. A method of preparing a surface for electrochemical deposition, comprising:
    forming a high conductance barrier layer having a resistivity of less than about 160 $\mu\Omega$-cm on the surface by forming a first barrier layer over the surface using chemical vapor deposition and by forming a second barrier layer over the first barrier layer using physical vapor deposition; and
    depositing a copper seed layer over the high conductance barrier layer utilizing high density plasma physical vapor deposition.

7. The method of claim 6, wherein the seed layer is deposited to a bottom film thickness between about 250 Å and about 1,500 Å.

8. The method of claim 7, wherein the seed layer is deposited to a sidewall film thickness less than about 250 Å.

9. The method of claim 6, wherein the high conductance barrier layer comprises a material selected from the group consisting of tungsten, tungsten nitride, titanium, titanium nitride, and combinations thereof.

10. The method of claim 6, wherein the high conductance barrier layer comprises a multi-layered stack of one or more materials selected from the group consisting of tungsten, tungsten nitride, titanium, titanium nitride, and combinations thereof.

11. The method of claim 6, wherein forming a second barrier layer comprises:

depositing a layer comprising tantalum; and annealing the layer at a temperature between about 350° C. and about 600° C. for between about 30 seconds and about 30 minutes.

12. The method of claim 11, wherein annealing the layer comprises annealing the layer at a temperature between about 450° C. and about 500° C.

13. The method of claim 6, wherein forming a high conductance barrier layer comprises depositing a layer comprising tantalum at a deposition temperature between about 350° C. and about 600° C.

14. The method of claim 6, wherein forming a high conductance barrier layer comprises depositing a layer comprising tantalum utilizing high density plasma physical vapor deposition.

15. The method of claim 14, wherein the layer is deposited at a substrate temperature between about 350° C. and about 600° C.

16. The method of claim 14, wherein the layer is deposited at a processing pressure between about 20 mTorr and about 100 mTorr.

17. The method of claim 14, wherein the layer is deposited at a substrate temperature between about 350° C. and about 600° C. and at a processing pressure between about 20 mTorr and about 100 mTorr.

18. The method of claim 6, wherein the first barrier layer comprises a material selected from the group consisting of titanium nitride, tungsten, tungsten nitride, and combinations thereof.

19. The method of claim 6, wherein the second barrier layer comprises a material selected from the group consisting of tantalum, tantalum nitride, and combinations thereof.

* * * * *